United States Patent
Agrawal et al.

(10) Patent No.: US 12,557,340 B2
(45) Date of Patent: Feb. 17, 2026

(54) CLADDING AND CONDENSATION FOR STRAINED SEMICONDUCTOR NANORIBBONS

(71) Applicant: Intel Corporation, Santa Clara, CA (US)

(72) Inventors: Ashish Agrawal, Hillsboro, OR (US); Anand Murthy, Portland, OR (US); Jack T. Kavalieros, Portland, OR (US); Rajat K. Paul, Portland, OR (US); Gilbert Dewey, Beaverton, OR (US); Susmita Ghose, Hillsboro, OR (US); Seung Hoon Sung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 952 days.

(21) Appl. No.: 17/523,711

(22) Filed: Nov. 10, 2021

(65) Prior Publication Data

US 2023/0141914 A1    May 11, 2023

(51) Int. Cl.
*H01L 29/423* (2006.01)
*H10D 30/67* (2025.01)
(Continued)

(52) U.S. Cl.
CPC ..... *H10D 30/6735* (2025.01); *H10D 30/6757* (2025.01); *H10D 62/118* (2025.01); *H10D 62/832* (2025.01)

(58) Field of Classification Search
CPC ........... H10D 30/6735; H10D 30/6757; H10D 62/118; H10D 62/832; H10D 30/014;
(Continued)

(56) References Cited

U.S. PATENT DOCUMENTS 9,870,984 B2    1/2018    Ranmuthu
11,557,659 B2    1/2023    Wang et al.
(Continued)

OTHER PUBLICATIONS

Extended European Search Report received for EP Application No. 22200636.3, mailed Apr. 11, 2023. 12 pages.
(Continued)

*Primary Examiner* — Cuong B Nguyen
(74) *Attorney, Agent, or Firm* — Arcane Law PLLC

(57) ABSTRACT

Techniques are provided herein to form semiconductor devices having nanowires with an increased strain. A thin layer of silicon germanium or germanium tin can be deposited over one or more suspended nanoribbons. An anneal process may then be used to drive the silicon germanium or germanium tin throughout the one or more semiconductor nanoribbons, thus forming one or more nanoribbons with a changing material composition along the lengths of the one or more nanoribbons. In some examples, at least one of the one or more nanoribbons includes a first region at one end of the nanoribbon having substantially no germanium, a second region at the other end of the nanoribbon having substantially no germanium, and a third region between the first and second regions having a substantially uniform non-zero germanium concentration. The change in material composition along the length of the nanoribbon imparts a compressive strain.

20 Claims, 10 Drawing Sheets

(51) Int. Cl.
*H10D 62/10* (2025.01)
*H10D 62/832* (2025.01)

(58) Field of Classification Search
CPC .... H10D 30/43; H10D 30/751; H10D 62/121; H10D 62/822; H10D 64/017; H10D 30/791; H10D 62/124; H10D 62/834; H10D 84/0128; H10D 84/0151; H10D 84/0158; H10D 84/038; H10D 84/834; H10D 62/83; H01L 21/2254; H01L 21/02532; H01L 21/02381; B82Y 10/00; B82Y 40/00

See application file for complete search history.

(56) References Cited

U.S. PATENT DOCUMENTS

| | | | |
|---|---|---|---|
| 2011/0070734 A1 | 3/2011 | Saracco et al. | |
| 2014/0203327 A1* | 7/2014 | Pillarisetty | H10D 62/122 438/285 |
| 2016/0329400 A1 | 11/2016 | Wen et al. | |
| 2018/0151452 A1 | 5/2018 | Doornbos et al. | |
| 2018/0204955 A1* | 7/2018 | Mehandru | H10D 84/853 |
| 2020/0144133 A1* | 5/2020 | Wang | H10D 84/0172 |
| 2020/0286992 A1* | 9/2020 | Song | H10D 30/43 |
| 2020/0294969 A1 | 9/2020 | Rachmady et al. | |
| 2020/0357931 A1 | 11/2020 | Lee et al. | |
| 2021/0232744 A1 | 7/2021 | Lin et al. | |
| 2021/0296506 A1 | 9/2021 | Wei et al. | |
| 2021/0343858 A1 | 11/2021 | Wang et al. | |
| 2023/0141914 A1 | 5/2023 | Agrawal et al. | |
| 2023/0147499 A1 | 5/2023 | Ashish et al. | |

OTHER PUBLICATIONS

Extended European Search Report received for EP Application No. 22200110.9, dated Mar. 23, 2023. 11 pages.

Takase, et al., J. Appl. Phys. Dec. 28, 2016; 120 (24) (Year: 2016).

Coplanar definition, Collins English Dictionary—Complete and Unabridged, 12th Edition 2014, (1991, 1994, 1998, 2000, 2003, 2006, 2007, 2009, 2011, 2014). Retrieved Feb. 3, 2025.

* cited by examiner

CLADDING AND CONDENSATION FOR STRAINED SEMICONDUCTOR NANORIBBONS

FIELD OF THE DISCLOSURE

The present disclosure relates to integrated circuits, and more particularly, to strained nanoribbons in semiconductor devices.

BACKGROUND

As integrated circuits continue to scale downward in size, a number of challenges arise. For instance, reducing the size of memory and logic cells is becoming increasingly more difficult. Different transistor architectures that maximize available semiconductor surfaces to form active channels have been contemplated, including nanosheet (e.g., gate-all-around) and forksheet architectures. However, such architectures come with drawbacks with regards to the strain placed on the semiconductor channels. For some devices, not enough strain can lead to poor device performance. Accordingly, there remain a number of non-trivial challenges with respect to forming certain transistor structures while maintaining a sufficient degree of strain on the semiconductor channels.

Figure 1:
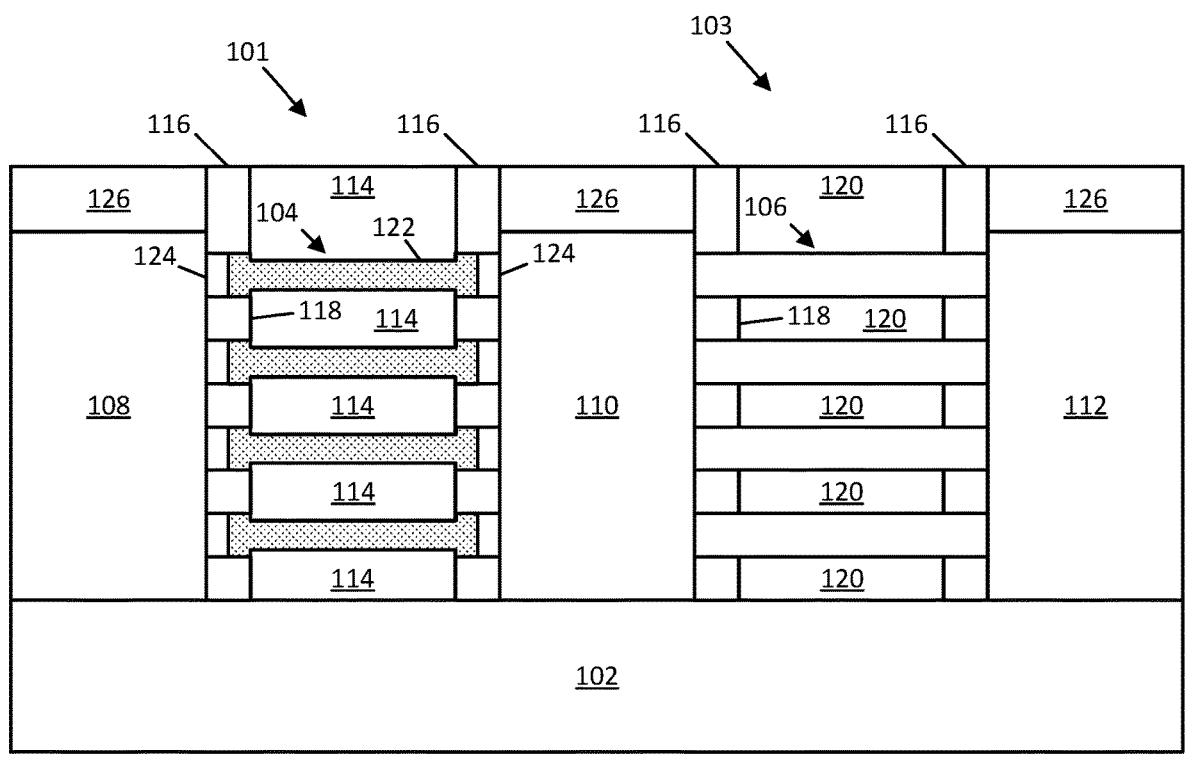
FIG. 1 is a cross-sectional view of a pair of semiconductor devices that illustrates a set of thinner, more strained nanowires on one of the semiconductor devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein to form semiconductor devices having nanowires with an increased strain. Imparting strain upon the semiconductor channel of a transistor can lead to a higher device performance. A thin layer of silicon germanium or germanium tin can be deposited over one or more suspended nanoribbons. An anneal process may then be used to drive the silicon germanium or germanium tin throughout the one or more semiconductor nanoribbons, thus forming one or more nanoribbons with a changing material composition along the lengths of the one or more nanoribbons. Specifically, in some examples, at least one of the one or more nanoribbons includes a first region at one end of the nanoribbon having substantially no germanium, a second region at the other end of the nanoribbon having substantially no germanium, and a third region between the first and second regions having a substantially consistent non-zero germanium concentration. The change in material composition along the length of the nanoribbon imparts a compressive strain that is especially helpful for PMOS devices having lower minority carrier mobility. Numerous variations and embodiments will be apparent in light of this disclosure.

General Overview

Gate-all-around (GAA) and forksheet device architectures typically have source, drain and gate structures that are isolated from the subfin layer to reduce parallel conduction between the source/drain and the substrate and to reduce parasitic capacitance between the gate and the substrate. However, isolating the source and drain regions from the substrate results in a loss of compressive strain in the channel, which can cause significant degradation in PMOS performance. As devices continue to scale smaller, mechanically imparting strain to the nanoribbons themselves becomes more difficult as gate structures become too small to impart any significant strain.

Thus, and in accordance with an embodiment of the present disclosure, techniques are provided herein to form semiconductor devices with intrinsically strained channels. Such techniques are especially useful for gate all around (GAA) or forksheet transistors that utilize one or more nanoribbons as the semiconductor channel between a source and drain region. For a given device where a compressive strain is desired (such as for a PMOS device), a germanium-containing material can be deposited over the nanowires. The exact material composition may vary depending on the application, but some examples include the deposition of silicon germanium (SiGe) over silicon (Si) nanowires or the deposition of germanium tin (GeSn) over germanium (Ge) nanowires. Next, the nanowires are annealed to drive the deposited material throughout the exposed portion of the nanowires. This leads to one or more nanowires that exhibit a change in their material composition along a length of the one or more nanowires. According to an embodiment, a given nanowire may exhibit substantially no germanium or tin concentration at a first end and an opposite second end of the nanowire (e.g. beneath a spacer structure), and a non-zero germanium or tin concentration along the length of the nanowire between the first and second ends. Additionally, due to an affect of the annealing process, the one or more nanowires may be thinner compared to other nanowires that were not exposed to the deposition of the germanium-containing material. Numerous variations and embodiments will be apparent in light of this disclosure.

According to an embodiment, an integrated circuit includes a semiconductor device having one or more semiconductor nanoribbons extending in a first direction between a source region and a drain region, a first spacer structure that extends in a second direction orthogonal to the first direction and around first ends of the one or more semiconductor nanoribbons, a second spacer structure that extends in the second direction and around second ends of the one or more semiconductor nanoribbons, and a gate structure around the one or more semiconductor nanoribbons and between the first and second spacer structures. At least one nanoribbon of the one or more semiconductor nanoribbons includes a first region at one end of the nanoribbon having substantially no germanium (Ge), a second region at the other end of the nanoribbon having substantially no germanium, and a third region between the first and second regions. An entirety of the third region has a non-zero Ge concentration and the third region extends through an entire thickness of the at least one nanoribbon.

According to another embodiment, an integrated circuit includes a semiconductor device having one or more semiconductor nanoribbons extending in a first direction between a source region and a drain region, a first spacer structure that extends in a second direction orthogonal to the first direction and around first ends of the one or more semiconductor nanoribbons, a second spacer structure that extends in the second direction and around second ends of the one or more semiconductor nanoribbons, and a gate structure around the one or more semiconductor nanoribbons and between the first and second spacer structures. At least one nanoribbon of the one or more semiconductor nanoribbons includes a first region at one end of the nanoribbon having substantially no tin (Sn), a second region at the other end of the nanoribbon having substantially no tin, and a third region between the first and second regions. An entirety of the third region has a non-zero Sn concentration and the third region extends through an entire thickness of the at least one nanoribbon.

According to another embodiment, a method of forming an integrated circuit includes forming a multilayer fin having first material layers alternating with second material layers, the second material layers comprising a semiconductor material suitable for use as a nanoribbon channel; forming spacer structures around exposed ends of the second material layers; removing the first material layers; thinning the suspended second material layers between the spacer structures; forming a layer containing germanium (Ge) or tin (Sn) around the suspended second material layers; and annealing the second material layers to drive the Ge or Sn throughout a thickness of the second material layers between the spacer structures.

The techniques can be used with any type of non-planar transistors, but are especially useful for nanowire and nanoribbon transistors (sometimes called GAA transistors or forksheet transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED) and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate thinner nanoribbons for some devices (e.g., PMOS devices) compared to other devices (e.g., NMOS devices). In some examples, the thinner nanoribbons may be between 3 nm and about 7 nm thinner compared to other nanoribbons. In some embodiments, such tools may indicate a change in material composition along the length of a given nanoribbon. For example, a nanoribbon may exhibit first and second ends under spacer structures that have substantially no germanium, while showing a non-zero germanium concentration along a length of the nanoribbon between the first and second ends. In another example, a nanoribbon may exhibit first and second ends under spacer structures that have substantially no tin, while showing a non-zero tin concentration along a length of the nanoribbon between the first and second ends.

It should be readily understood that the meaning of "above" and "over" in the present disclosure should be interpreted in the broadest manner such that "above" and "over" not only mean "directly on" something but also include the meaning of over something with an intermediate feature or a layer therebetween. As used herein, the term "backside" generally refers to the area beneath one or more semiconductor devices (below the device layer) either within the device substrate or in the region of the device substrate (in the case where the bulk of the device substrate has been removed). Note that the backside may become a frontside, and vice-versa, if a given structure is flipped. To this end, and as will be appreciated, the use of terms like "above" "below" "beneath" "upper" "lower" "top" and "bottom" are used to facilitate discussion and are not intended to implicate a rigid structure or fixed orientation; rather such terms merely indicate spatial relationships when the structure is in a given orientation.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Architecture

FIG. 1 is a cross-sectional view taken across a first semiconductor device 101 and a second semiconductor device 103, according to an embodiment of the present disclosure. Each of first and second semiconductor devices 101 and 103 may be any type of non-planar metal oxide semiconductor (MOS) transistor, such as a tri-gate, gate-all-around (GAA), or forksheet transistor, although other transistor topologies and types could also benefit from the techniques provided herein. The illustrated embodiments herein use the GAA structure.

First and second semiconductor devices 101 and 103 together represent a portion of an integrated circuit that may contain any number of similar semiconductor devices. Additionally, first and second semiconductor devices 101 and 103 are provided side-by-side for clarity and for ease of discussion when comparing and contrasting the devices. However, second semiconductor device 103 could exist anywhere else within the integrated circuit and is not required to be linked with first semiconductor device 101 via a shared source or drain region. The arrangement of first semiconductor device 101 sharing a source or drain region with second semiconductor device 103 may be used in various common circuit structures, such as an inverter.

As can be seen, semiconductor devices 101 and 103 are formed on a substrate 102. Any number of other semiconductor devices can be formed on substrate 102, but two are illustrated here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

First semiconductor device 101 may include any number of semiconductor nanoribbons 104 while second semiconductor device 103 similarly may include any number of semiconductor nanoribbons 106. Nanoribbons 104 may extend between a source region 108 and a drain region 110. Likewise, nanoribbons 106 may extend between a source region 112 and drain region 110. Any source region may also act as a drain region and vice versa, depending on the application. Furthermore, as noted above, nanoribbons 106 of second semiconductor device 103 may extend between source region 112 and a drain region that is different from drain region 110.

In some embodiments, semiconductor devices 101 and 103 have an equal number of nanoribbons, while in other embodiments they have an unequal number of nanoribbons. In some embodiments, each of nanoribbons 104 and nanoribbons 106 are formed from a fin of alternating material layers (e.g., alternating layers of silicon and silicon germanium) where sacrificial material layers are removed between nanoribbons 104 and nanoribbons 106. Each of nanoribbons 104 and nanoribbons 106 may include the same semiconductor material as substrate 102, or not. In still other cases, substrate 102 is removed. In some such cases, there may be, for example one or more backside interconnect and/or contact layers. According to some embodiments, semiconductor device 101 is a p-channel device having semiconductor nanoribbons 104 doped with n-type dopants (e.g., phosphorous or arsenic) and semiconductor device 103 is an n-channel device having semiconductor nanoribbons 106 doped with p-type dopants (e.g., boron).

According to some embodiments, source and drain regions 108/110/112 are epitaxial regions that are provided using an etch-and-replace process. In other embodiments any of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. Any number of source and drain configurations and materials can be used.

According to some embodiments, the fins or semiconductor material can be formed of material deposited over the underlying substrate 102. In one such example case, a blanket layer of silicon germanium (SiGe) can be deposited over a silicon substrate, and then patterned and etched to form a plurality of SiGe fins or nanoribbons. In another such example, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into fins, or deposited into fin-shaped trenches.

According to some embodiments, a first gate structure 114 is provided over each of nanoribbons 104 between spacer structures 116 and internal spacers 118. Similarly, a second gate structure 120 is provided over each of nanoribbons 106 between spacer structures 116 and internal spacers 118. Each of first and second gate structures 114 and 120 include both a gate dielectric around the corresponding nanoribbons and a gate electrode over the gate dielectric. The gate dielectric may also be deposited along sidewalls and the bottom of the trench between spacer structures 116 and internal spacers 118. The gate dielectric may include a single material layer or multiple stacked material layers. In some embodiments, the gate dielectric includes a first dielectric layer such as silicon oxide and a second dielectric layer that includes a high-K material such as hafnium oxide. The hafnium oxide may be doped with an element to affect the threshold voltage of the given semiconductor device. According to some embodiments, the doping element used in the gate dielectric is lanthanum.

According to some embodiments, first and second gate structures 114 and 120 include a gate electrode that extends over the gate dielectric around each of nanoribbons 104 and 106, respectively. The gate electrode may include any sufficiently conductive material such as a metal, metal alloy, or doped polysilicon. According to some embodiments, the gate electrode may be interrupted between any other semiconductor devices by a gate cut structure. In some embodiments, the gate electrode includes one or more work function metals around the corresponding nanoribbons. For example, first semiconductor device 101 may be a p-channel device that includes n-type dopants within nanoribbons 104 and includes a work function metal having titanium around nanoribbons 104. In another example, second semiconductor device 103 is an n-channel device that includes p-type dopants within nanoribbons 104 and includes a work function metal having tungsten around nanoribbons 104. In some embodiments, first and second gate electrodes 114 and 120 each includes a fill metal or other conductive material around the work function metal(s) to provide the whole gate electrode structure.

According to some embodiments, at least one of nanoribbons 104 includes a material concentration gradient along its length that differentiates the at least one nanoribbon into at least two sections. For example, a first section 122 extends along a length of nanoribbon 104 and is between a second section 124 at either end of nanoribbon 104. According to some embodiments, first section 122 of nanoribbon 104 includes a non-zero concentration of germanium (Ge) while second section 124 at either end of nanoribbon 104 include no Ge. For example, first section 122 may be silicon germanium (SiGe) with a Ge concentration between 10% and 90%, between 20% and 80%, between 30% and 70%, between 40% and 60%, or around 50%. In some examples, first section 122 includes less than 10% Ge or greater than 90% Ge. Second section 124 at either end of nanoribbon 104 may include silicon (Si) with substantially no Ge (e.g., less than 1%). According to some other embodiments, first section 122 of nanoribbon 104 includes a non-zero concentration of tin (Sn) while second section 124 at either end of nanoribbon 104 include no Sn. For example, first section 122 may be germanium tin (GeSn) with a Sn concentration between 10% and 90%, between 20% and 80%, between 30% and 70%, between 40% and 60%, or around 50%. In some examples, first section 122 includes less than 10% Sn or greater than 90% Sn. Second section 124 at either end of nanoribbon 104 may include Ge with substantially no Sn (e.g., less than 1%). According to some embodiments, second sections 124 are surrounded by spacer structures 116 and/or internal spacers 118. According to some embodiments, first section 122 having either the non-zero Ge or Sn concentration extends through an entire thickness of nanoribbon 104 and may extend along an entire length of nanoribbon 104 between second sections 124.

According to some embodiments, one or more of nanoribbons 104 are thinner between spacer structures 116 and/or internal spacers 118 compared to other nanoribbons from other structures that do not have the material gradient, such as nanoribbons 106 from second semiconductor device 103. For example, nanoribbons 104 may be between 3 nm and 8 nm thinner compared to nanoribbons 106. In some embodiments, first region 122 of nanoribbon 104 is between about 3 nm and about 8 nm thinner compared to second region 124 of nanoribbon 104.

According to some embodiments, first semiconductor device 101 is a p-channel device having nanoribbons 104 with the Ge or Sn concentration gradient along its length to impart more compressive strain upon nanoribbons 104. Conversely, second semiconductor device 103 may be an n-channel device having nanoribbons 106 without the concentration gradient of Ge or Sn. In this way, p-channel devices of the integrated circuit may be more compressively strained compared to n-channel devices of the integrated circuit.

A conductive contact 126 may be formed over each of source and drain regions 108/110/112 to provide electrical connections to each of source and drain regions 108/110/112. Conductive contact 126 can include any suitable conductive material, such as tungsten, copper, cobalt, titanium, ruthenium, or tantalum.

Fabrication Methodology

FIGS. 2A-2L include cross-sectional views that collectively illustrate an example process for forming an integrated circuit configured with semiconductor devices having intrinsically strained nanoribbons, according to some embodiments. Each figure shows an example structure that results from the process flow up to that point in time, so the depicted structure evolves as the process flow continues, culminating in the structure shown in FIG. 2L, which is similar to the structure shown in FIG. 1. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
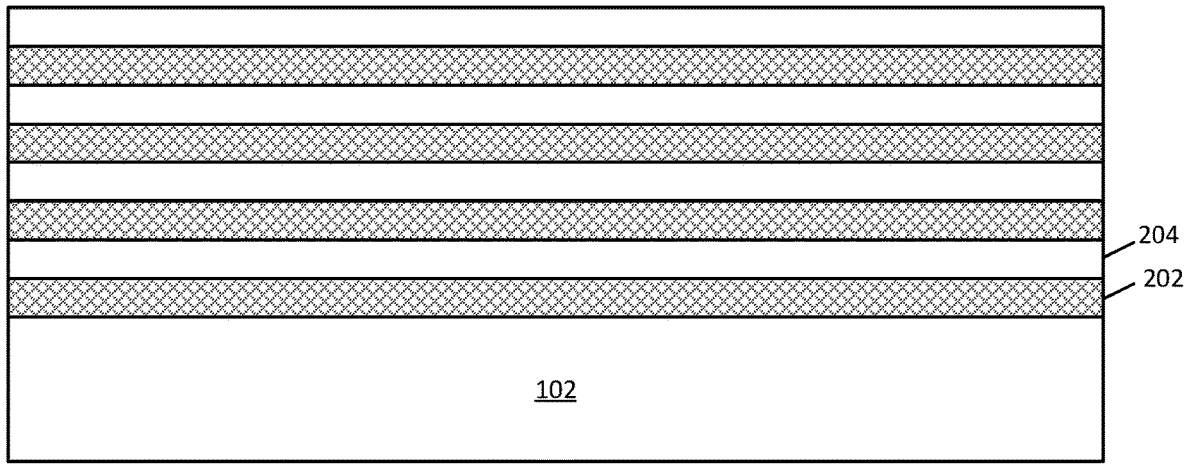
FIGS. 2A-2L are cross-section views that illustrate various stages in an example process for forming a semiconductor device with nanowires having an increased strain, in accordance with some embodiments of the present disclosure.

FIG. 2A illustrates substrate 102 having a series of material layers formed over the substrate, according to an embodiment of the present disclosure. Alternating material layers may be deposited over substrate 102 including sacrificial layers 202 alternating with semiconductor layers 204. Any number of alternating semiconductor layers 204 and sacrificial layers 202 may be deposited over substrate 102. It should be noted that the cross section illustrated in FIG. 2A is taken along the length of a fin formed from the multiple layers and extending up above the surface of substrate 102.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. Semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known material deposition technique, such as chemical vapor deposition (CVD), plasma-enhanced chemical vapor deposition (PECVD), physical vapor deposition (PVD), or atomic layer deposition (ALD).

Figure 2B:
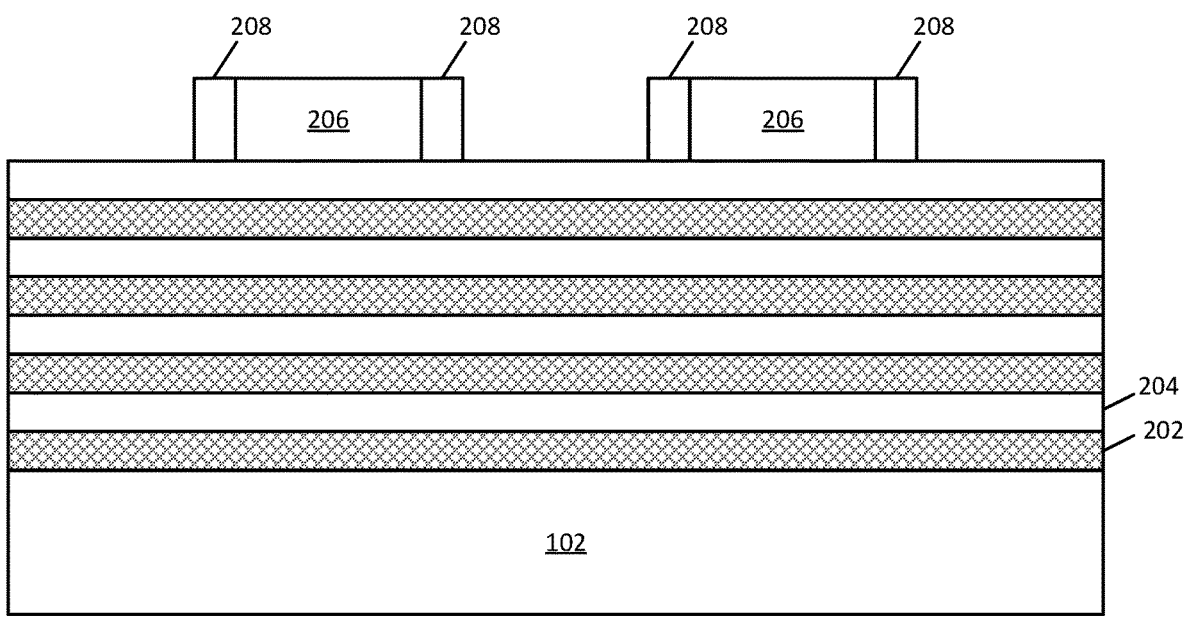

FIG. 2B illustrates a cross-sectional view of the structure shown in FIG. 2A following the formation of sacrificial gate structures 206 and sidewall spacers 208 over the alternating layer structure of the fin, according to an embodiment. Sacrificial gate structures 206 may run in an orthogonal direction to the length of the fin and may include any material that can be safely removed later in the process without etching or otherwise damaging any portions of the fin or of spacer structures 208. In some embodiments, sacrificial gate structures 206 include polysilicon. Spacer structures 208 may be formed using an etch-back process where spacer material is deposited everywhere and then anisotropically etched to leave the material only on sidewalls of structures including sacrificial gate structures 206. Spacer structures 208 may include a dielectric material, such as silicon nitride, silicon oxy-nitride, or any formulation of those layers incorporating carbon or boron dopants. Sacrificial gate structures 206 together with spacer structures 208 define portions of the fin that will be used to form first and second semiconductor devices, as discussed further herein.

Figure 2C:
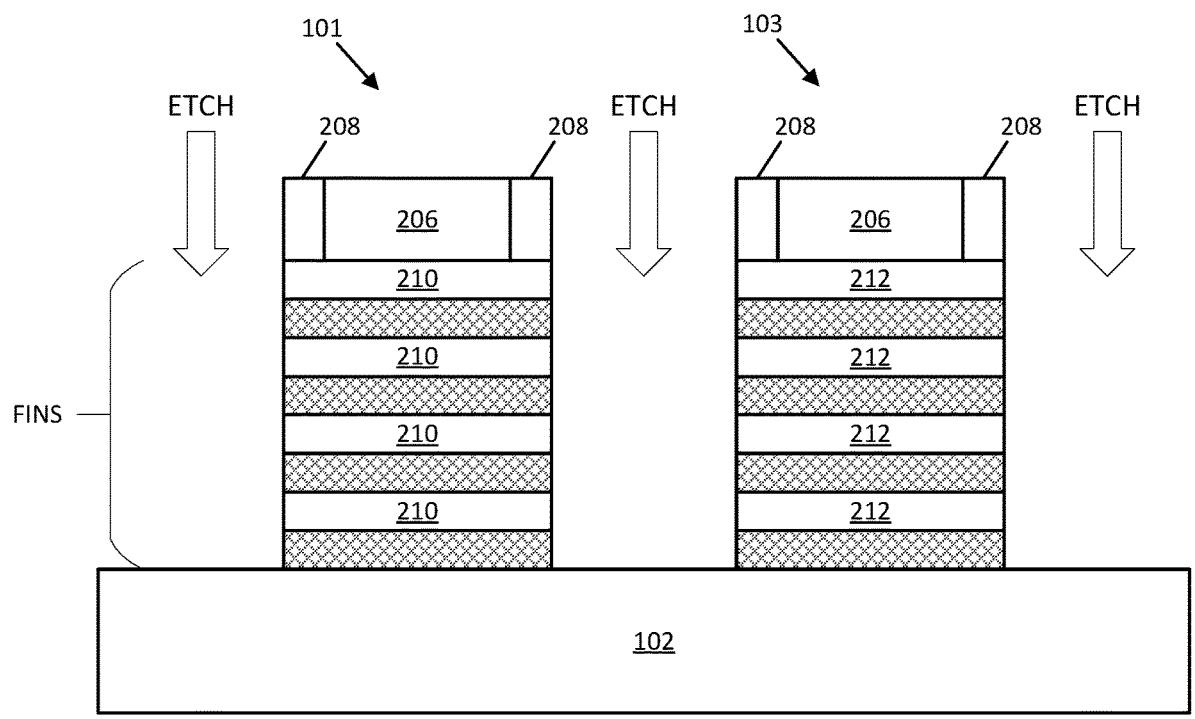

FIG. 2C illustrates a cross-sectional view of the structure shown in FIG. 2B following the removal of the exposed fin not under sacrificial gate structures 206 and sidewall spacers 208, according to an embodiment of the present disclosure. According to some embodiments, the various alternating material layers are etched at substantially the same rate using an anisotropic RIE process. In some embodiments, some undercutting occurs along the edges of the resulting fins beneath spacer structures 208 such that the length of a given fin is not exactly the same as a sum of the widths of spacer structures 208 and a width of sacrificial gate structure 206. The RIE process may also etch into substrate 102 thus recessing portions of substrate 102 on either side of any of the fins. According to some embodiments, a first fin includes first semiconductor layers 210 while a second fin includes second semiconductor layers 212.

Figure 2D:
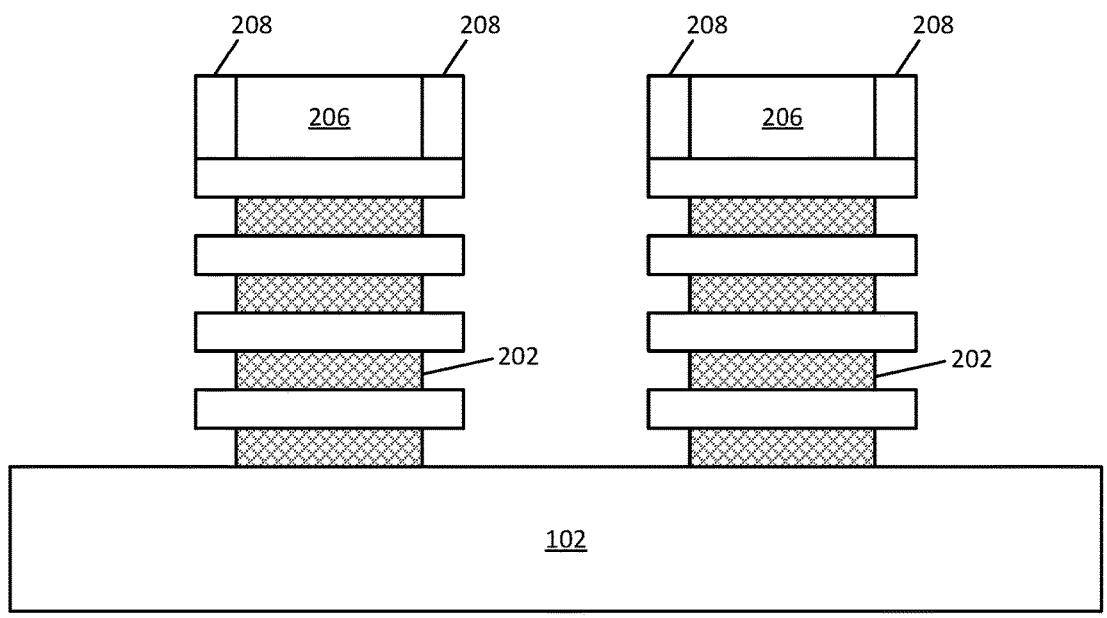

FIG. 2D illustrates a cross-sectional view of the structure shown in FIG. 2C following the removal of portions of sacrificial layers 202, according to an embodiment of the present disclosure. An isotropic etching process may be used to recess the exposed ends of each sacrificial layers 202.

Figure 2E:
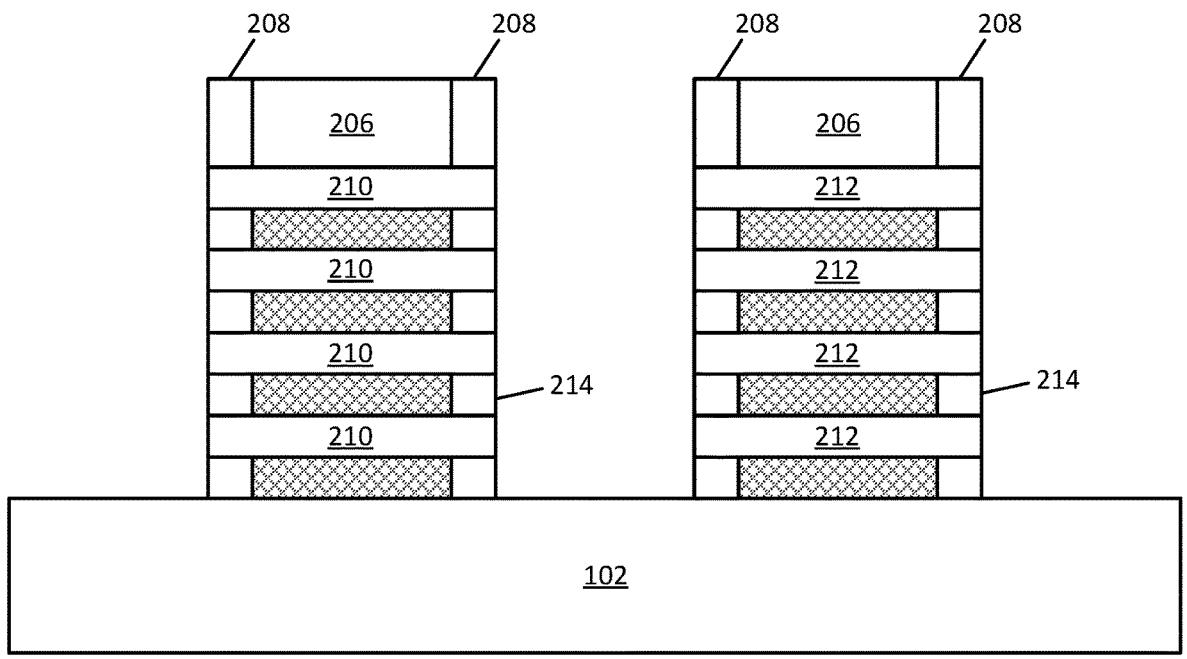

FIG. 2E illustrates a cross-sectional view of the structure shown in FIG. 2D following the formation of internal spacers 214, according to an embodiment of the present disclosure. Internal spacers 214 may have a material composition that is similar to or the exact same as spacer structures 208. Accordingly, internal spacers 214 may be any suitable dielectric material that exhibits high etch selectively to semiconductor materials such as silicon and/or silicon germanium. Internal spacers 214 may be conformally deposited over the sides of the fin structure using a CVD process like ALD and then etched back using an isotropic etching process to expose the ends of first semiconductor layers 210 and second semiconductor layers 212.

Figure 2F:
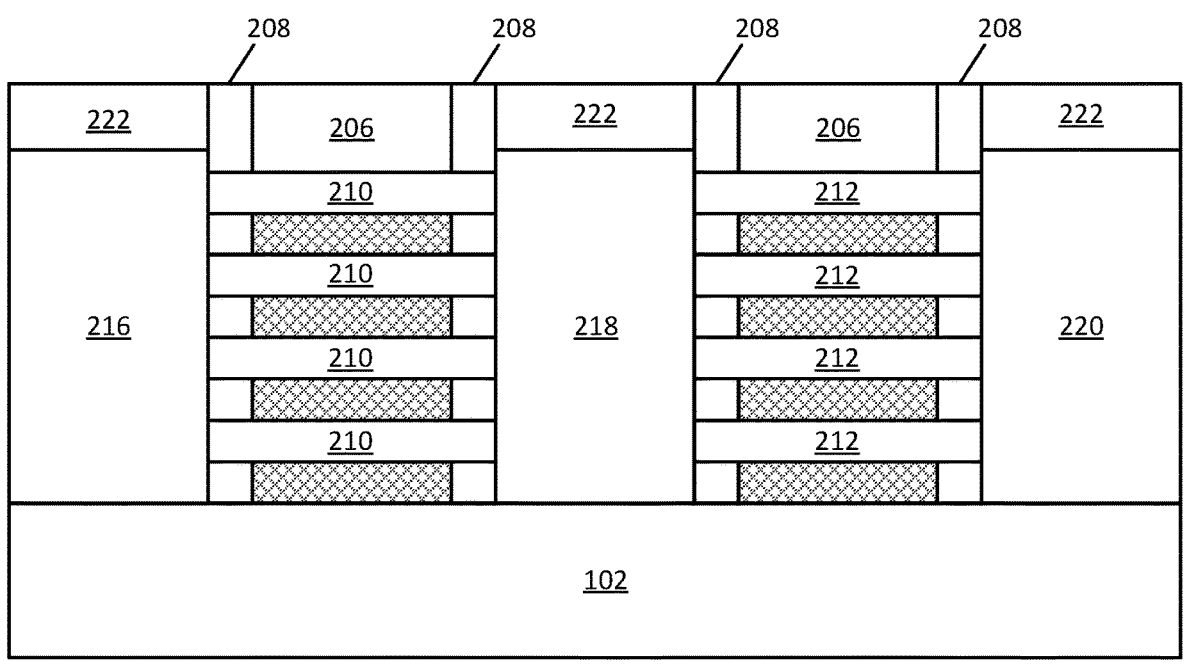

FIG. 2F illustrates a cross-sectional view of the structure shown in FIG. 2E following the formation of source and drain regions, according to an embodiment of the present disclosure. According to an embodiment, a source region 216 is formed at first ends of first semiconductor layers 210 and a drain region 218 is formed between second ends of first semiconductor layers 210 and first ends of second semiconductor layers 212. Another source region 220 may be formed at second ends of second semiconductor layers 212. As noted above, any of source and drain regions 216/218/220 can act as either a source or drain depending on the application. In some examples, source and drain regions 216/218/220 are epitaxially grown from the ends of semiconductor layers 210 and 212. Any semiconductor materials suitable for source and drain regions 216/218/220 can be used (e.g., group IV and group III-V semiconductor materials). Source and drain regions 216/218/220 may include multiple layers such as liners and capping layers to improve contact resistance. In any such cases, the composition and doping of source and drain regions 216/218/220 may be the same or different, depending on the polarity of the transistors. Any number of source and drain configurations and materials can be used.

A dielectric cap layer 222 may be formed over each of source and drain regions 216/218/220, according to some embodiments. Dielectric cap layer 222 allows for a planarized structure, such that the top surface of sacrificial gate structure 206 is co-planar with the top surface of dielectric cap layer 222. Dielectric cap layer 222 may be any suitable dielectric material, such as silicon oxide, aluminum oxide, silicon nitride, or silicon oxycarbonitride.

Figure 2G:
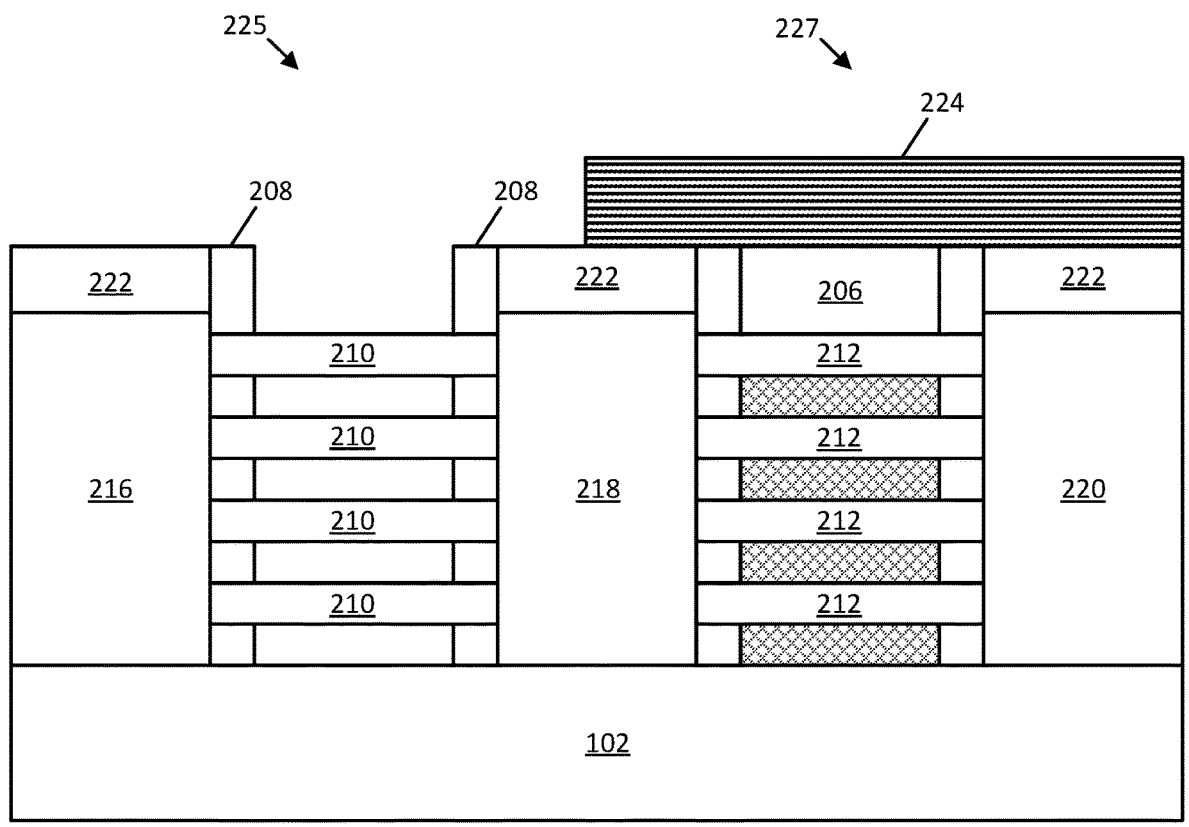

FIG. 2G illustrates a cross-sectional view of the structure shown in FIG. 2F following the removal of the sacrificial gate structure 206 and sacrificial layers 202 for a first semiconductor device 225, according to an embodiment of the present disclosure. A masking layer 224 may first be patterned over a second semiconductor device 227 to protect it from the etching process that removes sacrificial gate structure 206 and sacrificial layers 202 from first semiconductor device 225. Masking layer 224 may be a carbon hard mask (CHM) or any other type of photoresist. It should be understood that masking layer 224 may be patterned to protect any number of semiconductor devices while leaving any number of other semiconductor devices exposed. In some embodiments, masking layer 224 is patterned to protect one or more n-channel devices while leaving one or more other p-channel devices exposed.

The exposed sacrificial gate structure 206 may be removed using any wet or dry isotropic process thus exposing the alternating layer stack of the fin within the trench left behind after the removal of sacrificial gate structure 206. Once sacrificial gate structure 206 has been removed, the exposed sacrificial layers 202 may also be removed using a selective isotropic etching process that removes the material of sacrificial layers 202 but does not remove (or removes very little of) first semiconductor layers 210. At this point, the suspended first semiconductor layers 210 form nanoribbons or nanowires that extend between source and drain regions 216/218.

Figure 2H:
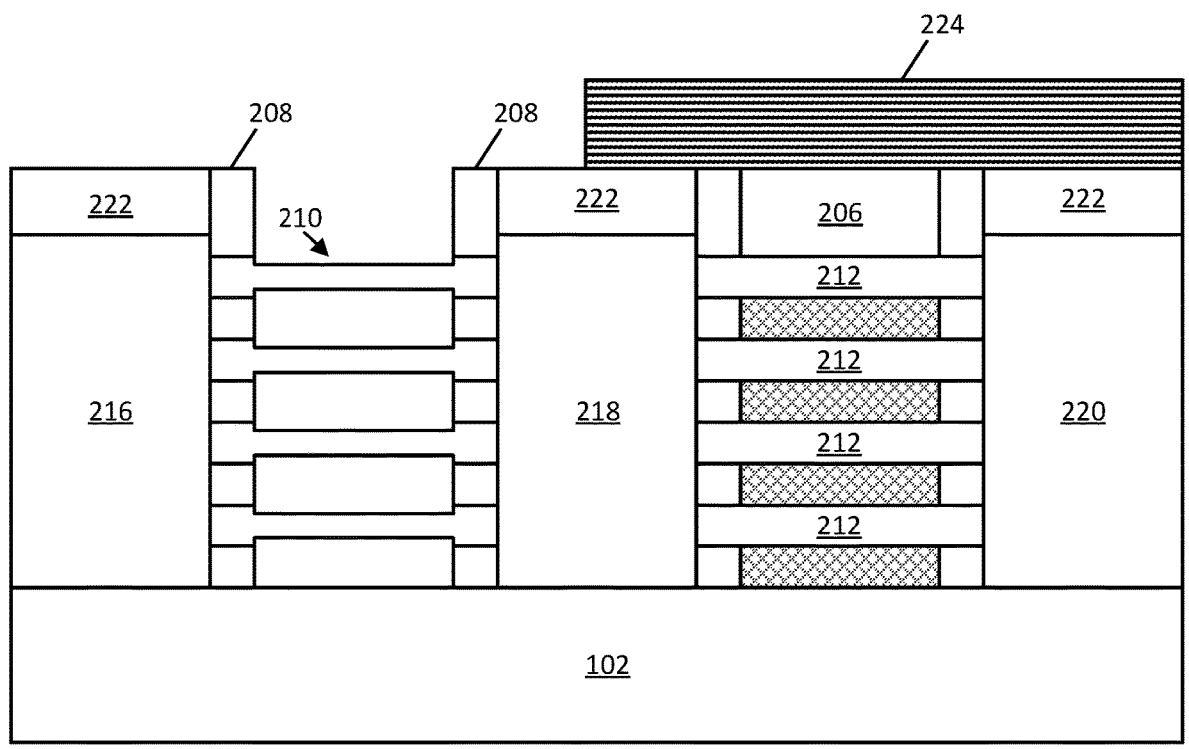

FIG. 2H illustrates a cross-sectional view of the structure shown in FIG. 2G following the thinning of first semiconductor layers 210, according to an embodiment of the present disclosure. First semiconductor layers 210 may be thinned using an isotropic dry etching process. According to some embodiments, first semiconductor layers 210 are thinned by between 2 nm and 8 nm, or between 5 nm and 6 nm. Due to the isotropic nature of the etching process, first semiconductor layers 210 may be made smaller on all sides, thus reducing the width of first semiconductor layers 210 between spacer structures 208 by the same amount (e.g., between about 2 nm and about 8 nm).

Figure 2I:
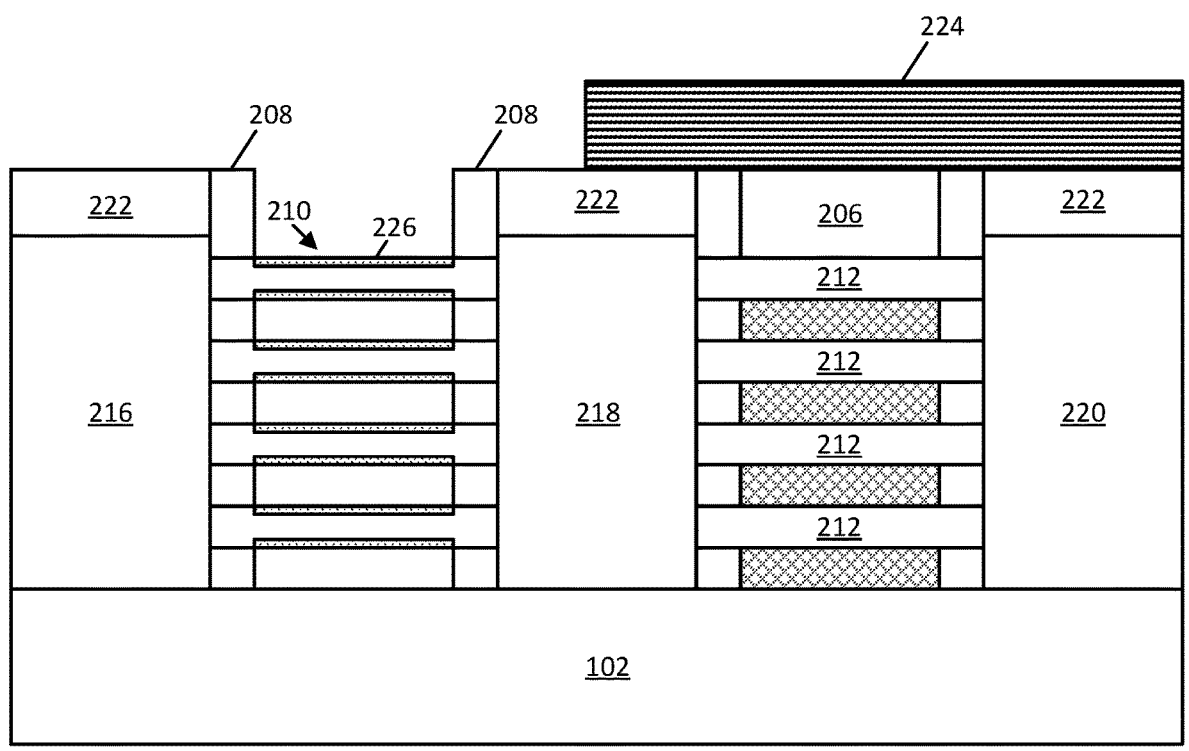

FIG. 2I illustrates a cross-sectional view of the structure shown in FIG. 2H following the formation of another material layer 226 over first semiconductor layers 210, according to an embodiment of the present disclosure. Material layer 226 may be formed by epitaxial growth on the exposed semiconductor surfaces of first semiconductor layers 210. In one example, first semiconductor layers 210 include silicon and material layer 226 includes silicon and germanium (SiGe) grown on the exposed silicon surfaces using a low pressure chemical vapor deposition (LPCVD) process. In another example, first semiconductor layers 210 include germanium and material layer 226 includes germanium and tin (GeSn) grown on the exposed germanium surfaces using a LPCVD process. In some embodiments, material layer 226 includes only germanium (e.g., 100% Ge) or only tin (e.g., 100% Sn). In some embodiments, the Ge or Sn concentration within material layer 226 is between 10% and 90%, between 20% and 80%, between 30% and 70%, between 40% and 60%, or around 50%. In some examples, material layer 226 includes less than 10% Ge or Sn, or greater than 90% Ge or Sn. According to some embodiments, material layer 226 is formed at a thickness between about 1 nm and about 4 nm. In some examples, material layer 226 has a thickness that is substantially the same as the amount in which first semiconductor layers 210 were thinned.

Figure 2J:
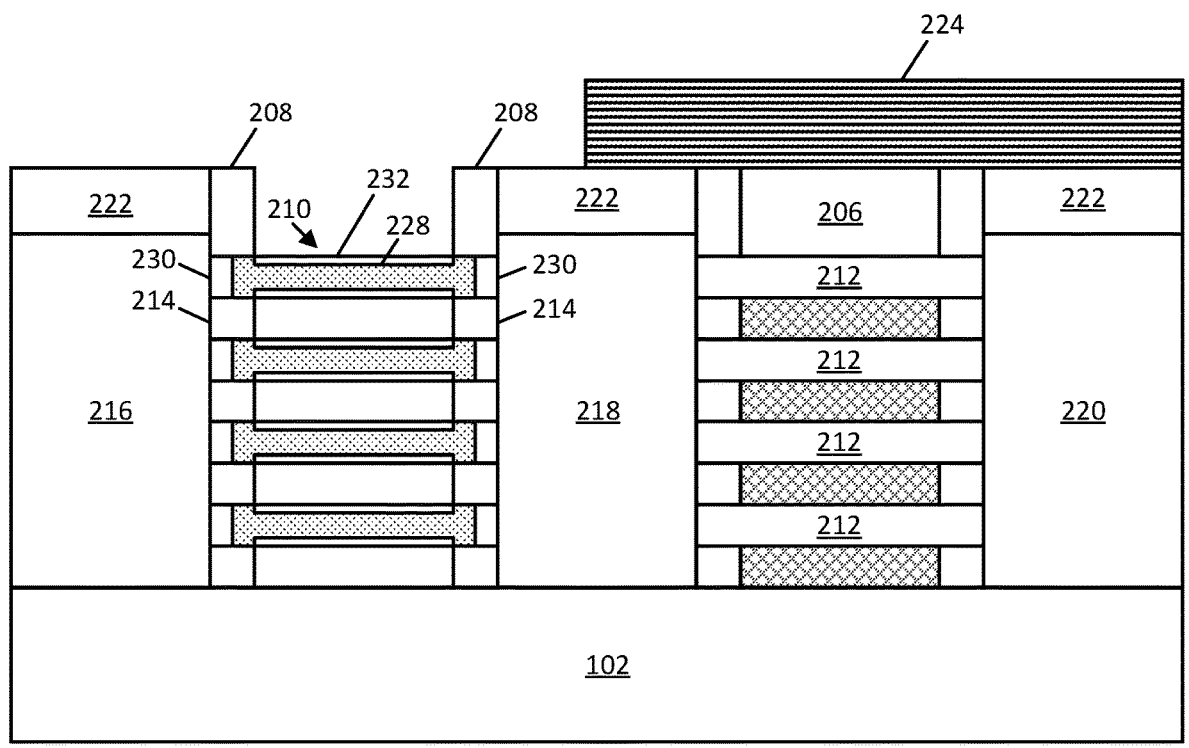

FIG. 2J illustrates a cross-sectional view of the structure shown in FIG. 2I following an anneal process to drive one or more elements of material layer 226 throughout first semiconductor layers 210, according to an embodiment of the present disclosure. First semiconductor layers 210 may be annealed at a temperature between about 800 C and 1000 C for between 1 millisecond and 3 milliseconds. Higher Ge concentrations within material layer 226 may use lower annealing temperature (e.g., less than 850 C) to sufficiently melt material layer 226 and drive the Ge into first semiconductor layers 210. By driving either the Ge or Sn into first semiconductor layers 210, a first region 228 of a given nanoribbon of first semiconductor layers 210 includes a non-zero Ge or Sn concentration throughout a thickness of the entire first region 228, according to some embodiments. Since material layer 226 deposits on the exposed portions of first semiconductor layers 210 between spacer structures 208, it may not extend laterally to the ends of first semiconductor layers 210. Accordingly, the given nanoribbon of first semiconductor layers 210 includes second regions 230 at either end of the given nanoribbon that have substantially no Ge or Sn concentration. Second regions 230 may contact corresponding source and drain regions 216 and 218 and may be surrounded by spacer structures 208 and/or internal spacers 214. Second regions 230 may also be referred to as a second region at one end of the given nanoribbon and a separate third region at the opposite end of the given nanoribbon.

In one example, first region 228 of a given nanoribbon of first semiconductor layers 210 includes silicon and a non-zero concentration of germanium, such as 10% Ge, 20% Ge, 30% Ge, 40% Ge, 50% Ge, 60% Ge, 70% Ge, 80% Ge, or 90% Ge. Additionally, second regions 230 include silicon and substantially no Ge (e.g., less than 1% Ge). In another example, first region 228 of a given nanoribbon of first semiconductor layers 210 includes germanium and a non-zero concentration of tin, such as 10% Sn, 20% Sn, 30% Sn, 40% Sn, 50% Sn, 60% Sn, 70% Sn, 80% Sn, or 90% Sn. Additionally, second regions 230 include germanium and substantially no Sn (e.g., less than 1% Sn). Other material combinations are possible as well.

According to some embodiments, the annealing process is performed in an oxygen-rich environment, which causes a thin oxide layer 232 to form around first semiconductor layers 210. Oxide layer 232 consumes some portion of first semiconductor layers 210 when it is formed, thus forming silicon oxide in the case of silicon semiconductor layers and germanium oxide in the case of germanium semiconductor layers, to name a few examples. According to some embodiments, oxide layer 232 is removed prior to the formation of a gate structure using any isotropic etch process. Since a portion of the semiconductor material of first semiconductor layers 210 is consumed to form oxide layer 232, removal of oxide layer 232 results in a thinner first semiconductor layers 210 compared to second semiconductor layers 212.

Figure 2K:
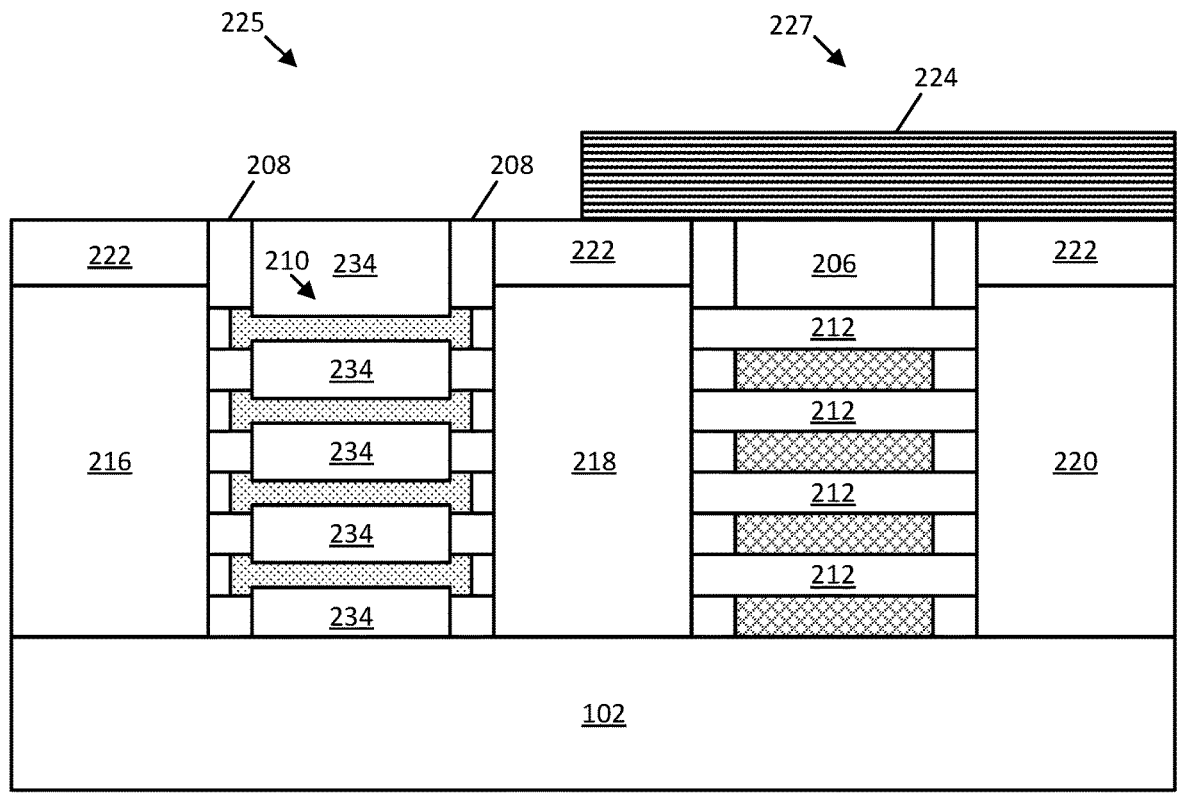

FIG. 2K illustrates a cross-sectional view of the structure shown in FIG. 2J following the formation of a first gate structure 234 around the suspended first semiconductor layers 210, according to an embodiment of the present disclosure. As noted above, first gate structure 234 includes a gate dielectric and a gate electrode.

The gate dielectric may be conformally deposited around first semiconductor layers 210 using any suitable deposition process, such as ALD. The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on first semiconductor layers 210, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-K material can be nitridized to improve its aging resistance.

The gate electrode may be deposited over the gate dielectric and can be any standard or proprietary gate structure that may include any number of gate cuts. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more workfunction layers, resistance-reducing layers, and/or barrier layers. In one example, first semiconductor device 225 is a PMOS device and the workfunction layers include, for example, p-type workfunction materials (e.g., titanium nitride). In the case of an NMOS device, n-type workfunction materials can include titanium aluminum carbide.

Figure 2L:
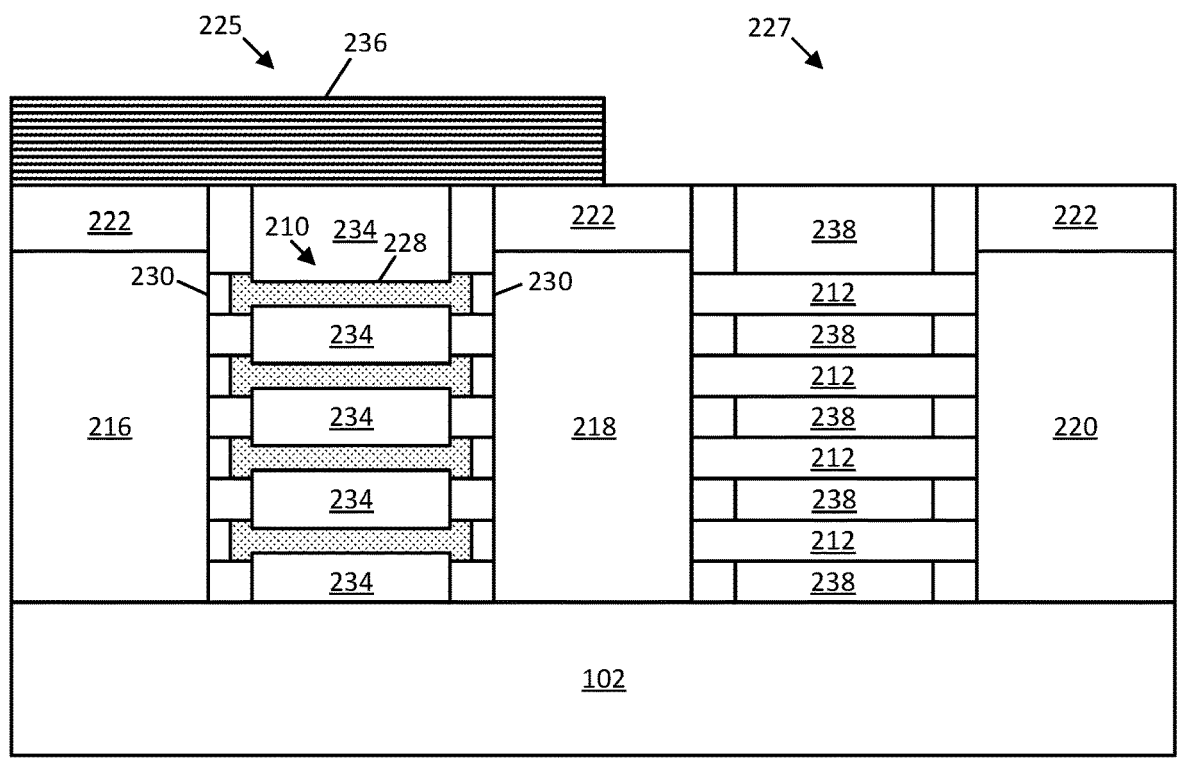

FIG. 2L depicts the cross-section view of the structure shown in FIG. 2M following the completion of the second semiconductor device 227, according to an embodiment of the present disclosure. Another masking layer 236 is formed to protect first semiconductor device 225 while exposing second semiconductor device 227. According to some embodiments, masking layer 236 may be used to protect any number of semiconductor devices that have already had their gate structures formed. Furthermore, any number of semiconductor devices may be exposed, such as second semiconductor device 227. A similar process to that described above for first semiconductor device 225 is then performed to remove sacrificial gate structure 206 and sacrificial layers 202 to yield suspended second semiconductor layers 212 that act as nanoribbons extending between drain region 218 and source region 220. A second gate structure 238 is formed around the suspended second semiconductor layers 212, according to an embodiment of the present disclosure. Like first gate structure 234, second gate structure 238 includes a gate dielectric and a gate electrode. According to some embodiments, second semiconductor device is an n-channel device and thus second gate structure 238 includes one or more n-type workfunction layers.

According to some embodiments, first semiconductor device 225 is representative of one or more p-channel devices in the integrated circuit and second semiconductor device 227 is representative of one or more n-channel devices in the integrated circuit. First semiconductor layers 210 of first semiconductor device 225 are thinner compared to second semiconductor layers 212 of second semiconductor device 227, such as around 2 nm to 8 nm thinner, according to some embodiments. The material composition of first semiconductor layers 210 is different from second semiconductor layers 212 owing to the deposition of the material layer 226 around the first semiconductor layers 210 and the subsequent annealing process. For example, first semiconductor layers 210 include first region 228 having silicon and germanium and second regions 230 having silicon but substantially no germanium while second semiconductor layers 212 include silicon and substantially no germanium. In another example, first semiconductor layers 210 include first region 228 having germanium and tin and second regions 230 having germanium but substantially no tin while second semiconductor layers 212 include germanium and substantially no tin. The material gradient of either Ge or Sn within first semiconductor layers 210 causes additional compressive stress within first semiconductor layers 210 as compared to second semiconductor layers 212.

Figure 3:
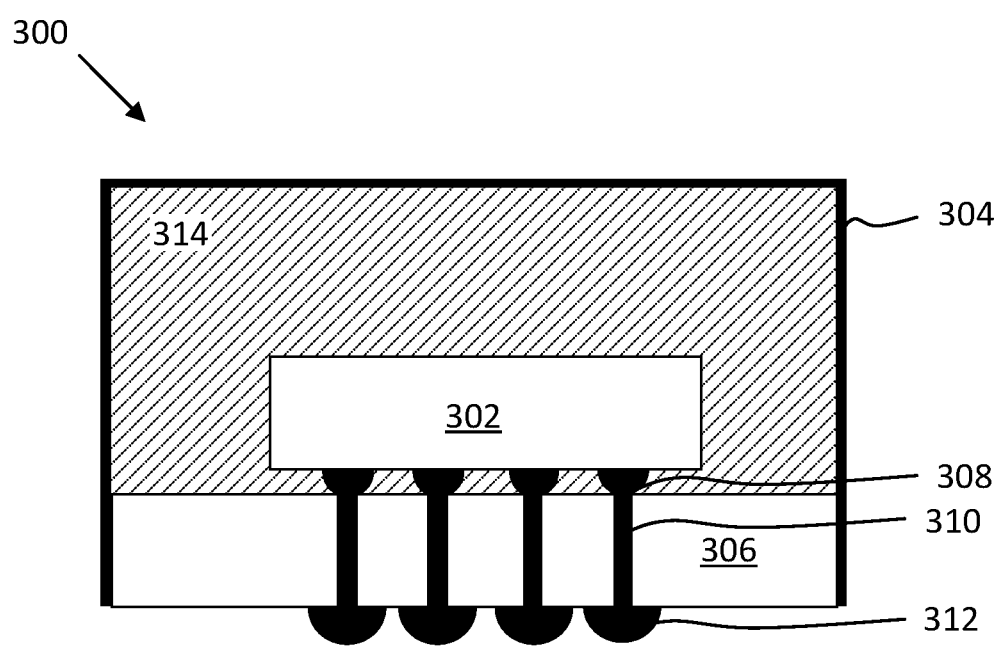
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having semiconductor devices, such as any of the semiconductor devices disclosed herein. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
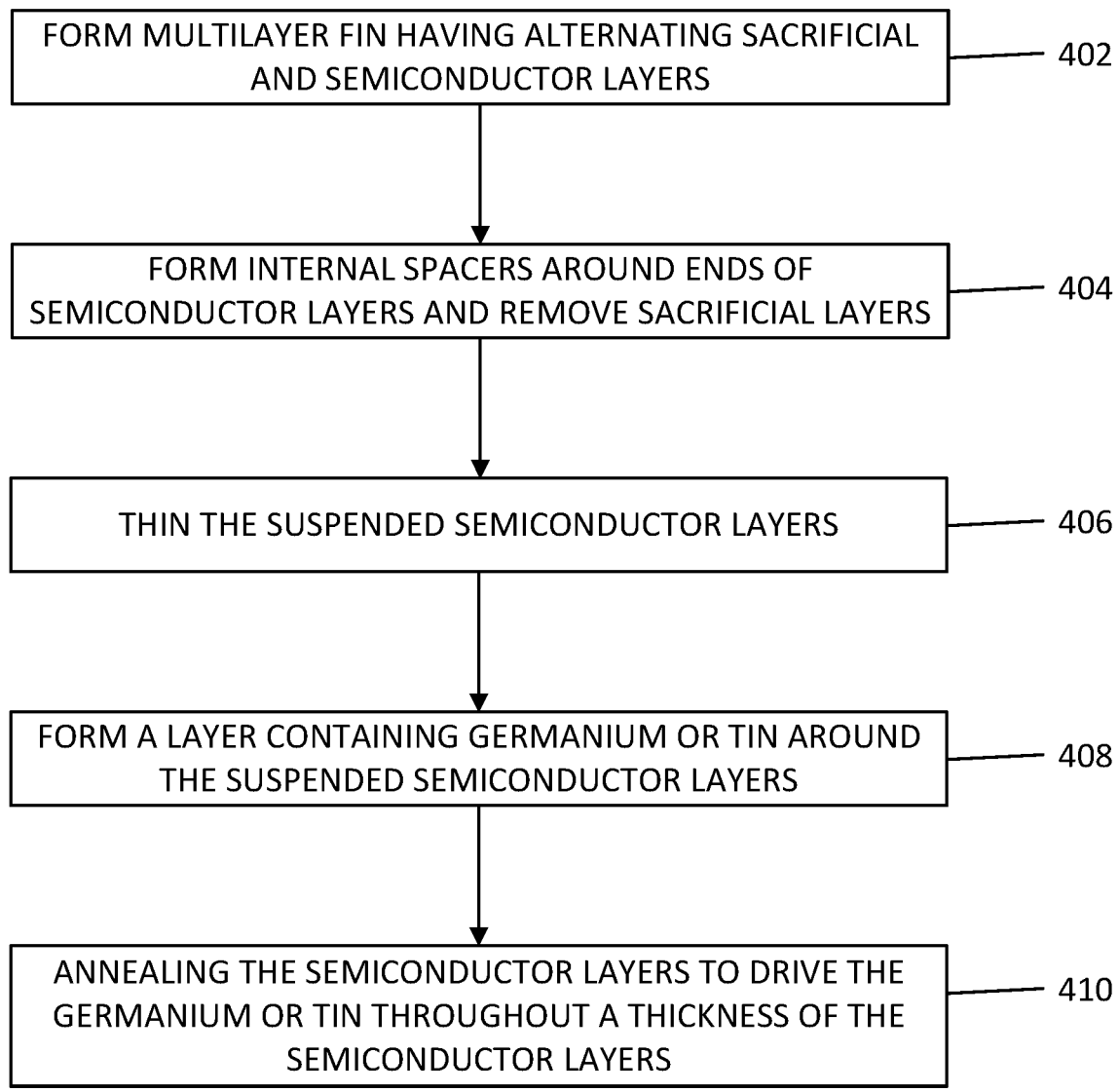
FIG. 4 is a flowchart of a fabrication process for semiconductor devices having nanowires with an increased strain, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2L. However, the correlation of the various operations of method 400 to the specific components illustrated in the aforementioned figures is not intended to imply any structural and/or use limitations. Rather, the aforementioned figures provide one example embodiment of method 400. Other operations may be performed before, during, or after any of the operations of method 400. Some of the operations of method 400 may be performed in a different order than the illustrated order.

Method 400 begins with operation 402 where a multilayer fin is formed having alternating semiconductor and sacrificial layers. The sacrificial layers may include SiGe while the semiconductor layers may be Si, SiGe, Ge, InP, or GaAs, to name a few examples. The thickness of each of the sacrificial and semiconductor layers may be between about 5 nm and about 20 nm or between about 5 nm and about 10 nm. Each of the sacrificial and semiconductor layers may be deposited using any known material deposition technique, such as CVD, PECVD, PVD, or ALD. The fin of alternating material layers may be defined by patterning a sacrificial gate and spacer structures that extend orthogonally over the fin, then etching around the sacrificial gate and spacer structures via an anisotropic etching process, such as RIE.

Method 400 continues with operation 404 where internal spacers are formed around the ends of the semiconductor layers and the sacrificial layers and sacrificial gate are both removed. The internal spacers may have a material composition that is similar to or the exact same as the spacer structures on either side of the sacrificial gate. Accordingly, the internal spacers may be any suitable dielectric material that exhibits high etch selectively to semiconductor materials such as silicon and/or silicon germanium. The sacrificial layers may first be laterally etched back while the internal spacers fill the recesses between the semiconductor layers. The internal spacers may be conformally deposited over the sides of the fin structure using a CVD process like ALD and then etched back using an isotropic etching process to expose the ends of the semiconductor layers.

Once the internal spacers have been formed, the sacrificial gate and sacrificial layers may be removed from the fin, leaving behind suspended semiconductor layers (e.g., nanoribbons) that extend between a source and drain region (also formed following the formation of the internal spacers). One or more isotropic etching procedures may be performed to remove the sacrificial gate and sacrificial layers.

Method 400 continues with operation 406 where the suspended semiconductor layers are thinned using an isotropic etching process. A dry etching process using a reactive gas to etch the semiconductor material of the suspended semiconductor layers may be used. According to some embodiments, the suspended semiconductor layers are thinned substantially equally on all sides by between 1 nm and 4 nm, for a total change in thickness of between about 2 nm and about 8 nm.

Method 400 continues with operation 408 where a material layer comprising either germanium or tin is formed around the suspended semiconductor layers. A LPCVD process may be used to form the material layer around the semiconductor layers based on the stoichiometry of the gas and the semiconductor material. For example, in the case of silicon semiconductor layers, a gas containing Ge may be used to form a material layer of SiGe around the semiconductor layers. In another example, in the case of germanium semiconductor layers, a gas containing Sn may be used to form a material layer of GeSn around the semiconductor layers. Other materials may be used as well.

In some embodiments, the Ge or Sn concentration within the material layer is between 10% and 90%, between 20% and 80%, between 30% and 70%, between 40% and 60%, or around 50%. In some examples, the material layer includes less than 10% Ge or Sn, or greater than 90% Ge or Sn. According to some embodiments, the material layer is formed at a thickness between about 1 nm and about 4 nm. In some examples, material layer 226 has a thickness that is substantially the same as the amount in which first semiconductor layers 210 were thinned.

Method 400 continues with operation 410 where the material layer and the semiconductor layers are annealed to drive the Ge or Sn throughout a thickness of the semiconductor layers. According to some embodiments, the Ge or Sn from the material layer on the surface of the semiconductor layers is driven through an entire thickness of the semiconductor layers, thus forming a region that extends along the length of the semiconductor layers and throughout its thickness that includes a non-zero Ge or Sn concentration. The ends of the semiconductor layers may be far enough away from the formed material layer that the Ge or Sn does not diffuse far enough to reach them, thus leaving the ends as having substantially no Ge or Sn.

The semiconductor layers and material layer on the surface of the semiconductor layers may be annealed at a temperature between about 800 C and 1000 C for between 1 millisecond and 3 milliseconds. According to some embodiments, the annealing is performed in an oxygen-rich environment, which causes a thin oxide to form over the resulting semiconductor layers. The oxide layer may be removed before further formation of any gate structures.

Example System

Figure 5:
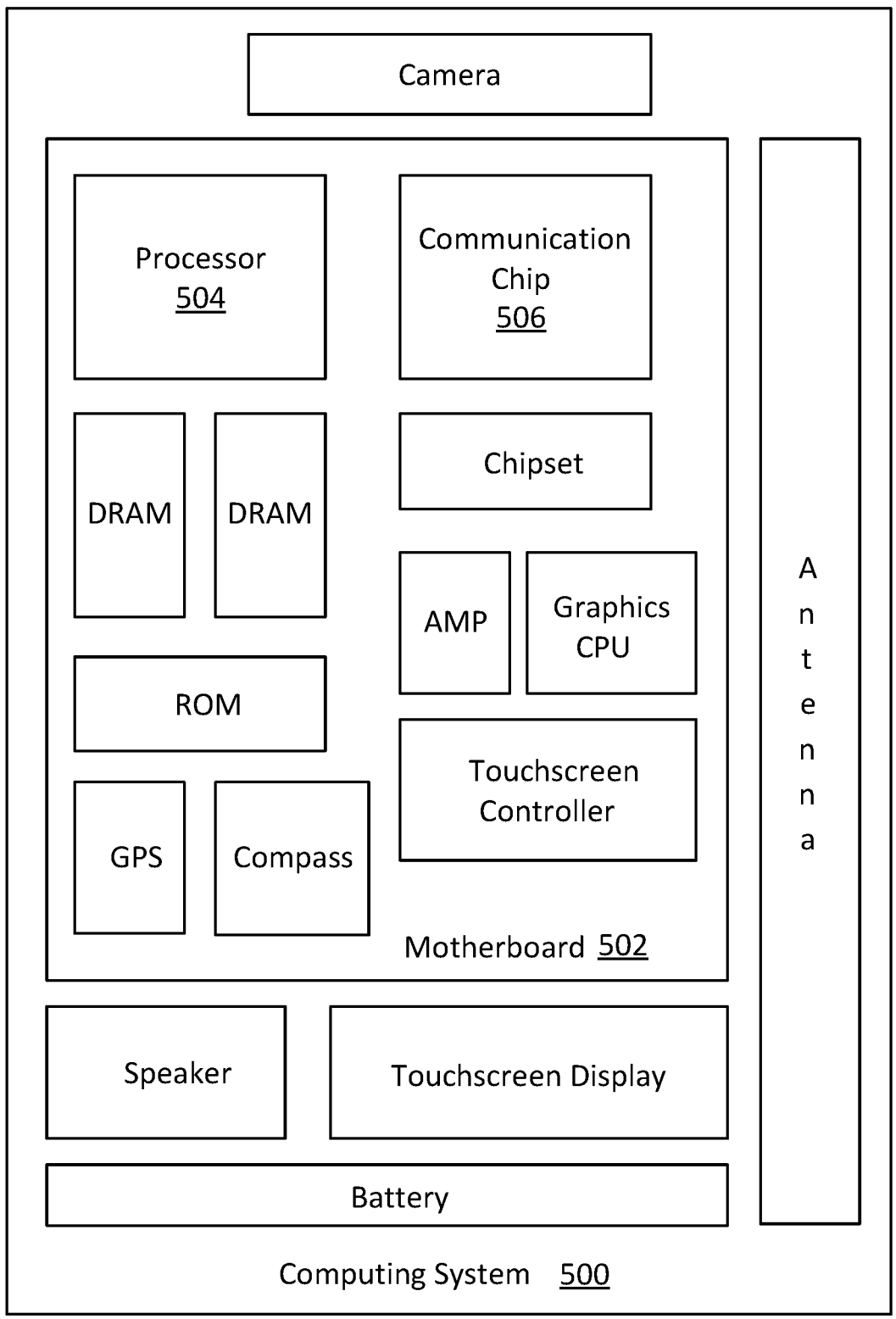
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit on a substrate, the substrate having semiconductor devices with higher intrinsic compressive strain compared to other devices, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit including a semiconductor device having one or more semiconductor nanoribbons extending between a source region and a drain region, a first spacer structure around first ends of the one or more semiconductor nanoribbons, a second spacer structure around second ends of the one or more semiconductor nanoribbons, and a gate structure around the one or more semiconductor nanoribbons and between the first and second spacer structures. At least one nanoribbon of the one or more semiconductor nanoribbons includes a first region at one end of the nanoribbon having substantially no germanium (Ge), a second region at the other end of the nanoribbon having substantially no germanium, and a third region between the first and second regions. An entirety of the third region has a non-zero Ge concentration, and the third region extends through an entire thickness of the at least one nanoribbon.

Example 2 includes the subject matter of Example 1, wherein the at least one nanoribbon comprises germanium and silicon.

Example 3 includes the subject matter of Example 2, wherein the at least one nanoribbon comprises p-type silicon.

Example 4 includes the subject matter of any one of Examples 1-3, wherein the third region extends along an entire length of the at least one nanoribbon between the first and second regions.

Example 5 includes the subject matter of any one of Examples 1-4, wherein the third region has a Ge concentration between 10% and 90%.

Example 6 includes the subject matter of any one of Examples 1-5, wherein the third region has a Ge concentration between 40% and 60%.

Example 7 includes the subject matter of any one of Examples 1-6, wherein the first spacer structure is around the first region and the second spacer structure is around the second region.

Example 8 includes the subject matter of any one of Examples 1-7, wherein a thickness of the third region of the at least one nanoribbon is less than a thickness of either the first or second regions of the at least one nanoribbon.

Example 9 is a printed circuit board that includes the integrated circuit of any one of Examples 1-8.

Example 10 is an electronic device having a chip package with one or more dies. At least one of the one or more dies includes a semiconductor device having one or more semiconductor nanoribbons extending between a source region and a drain region, a first spacer structure around first ends of the one or more semiconductor nanoribbons, a second spacer structure around second ends of the one or more semiconductor nanoribbons, and a gate structure around the one or more semiconductor nanoribbons and between the first and second spacer structures. At least one nanoribbon of the one or more semiconductor nanoribbons includes a first region at one end of the nanoribbon having substantially no germanium (Ge), a second region at the other end of the nanoribbon having substantially no germanium, and a third region between the first and second regions. An entirety of the third region has a non-zero Ge concentration, and the third region extends through an entire thickness of the at least one nanoribbon.

Example 11 includes the subject matter of Example 10, wherein the at least one nanoribbon comprises germanium and silicon.

Example 12 includes the subject matter of Example 11, wherein the at least one nanoribbon comprises p-type silicon.

Example 13 includes the subject matter of any one of Examples 10-12, wherein the third region extends along an entire length of the at least one nanoribbon between the first and second regions.

Example 14 includes the subject matter of any one of Examples 10-13, wherein the third region has a Ge concentration between 10% and 90%.

Example 15 includes the subject matter of any one of Examples 10-14, wherein the third region has a Ge concentration between 40% and 60%.

Example 16 includes the subject matter of any one of Examples 10-15, wherein the first spacer structure is around the first region and the second spacer structure is around the second region.

Example 17 includes the subject matter of any one of Examples 10-16, wherein a thickness of the third region of the at least one nanoribbon is less than a thickness of either the first or second regions of the at least one nanoribbon.

Example 18 includes the subject matter of any one of Examples 10-17, further comprising a printed circuit board, wherein the chip package is attached to the printed circuit board.

Example 19 is a method of forming an integrated circuit. The method includes forming a multilayer fin having first material layers alternating with second material layers, the second material layers comprising a semiconductor material suitable for use as a nanoribbon channel; forming spacer structures around exposed ends of the second material layers; removing the first material layers; thinning the second material layers between the spacer structures; forming a layer containing germanium (Ge) or tin (Sn) around the suspended second material layers; and annealing the second material layers to drive the Ge or Sn throughout a thickness of the second material layers between the spacer structures.

Example 20 includes the subject matter of Example 19, wherein first material layers comprise silicon (Si) and Ge and the second material layers comprise Si.

Example 21 includes the subject matter of Example 19 or 20, wherein thinning the second material layers comprises thinning the second material layers by between 2 nm and 8 nm.

Example 22 includes the subject matter of any one of Examples 19-21, wherein forming the layer containing Ge or Sn comprises forming the layer containing only Ge (100% Ge) or only Sn (100% Sn).

Example 23 includes the subject matter of any one of Examples 19-21, wherein forming the layer containing Ge or Sn comprises forming the layer comprising both Si and Ge or comprising both Ge and Sn.

Example 24 includes the subject matter of Example 23, wherein forming the layer containing Ge or Sn comprises forming the layer having a Ge concentration between 10% and 90% or a Sn concentration between 10% and 90%.

Example 25 includes the subject matter of Example 23 or 24, wherein forming the layer containing Ge or Sn comprises forming the layer having a Ge concentration between 40% and 60% or a Sn concentration between 40% and 60%.

Example 26 includes the subject matter of any one of Examples 19-25, wherein forming the layer containing Ge or Sn comprises forming the layer using low pressure chemical vapor deposition (LPCVD).

Example 27 includes the subject matter of any one of Examples 19-26, wherein annealing the second material layers comprises annealing at a temperature between 800 C and 1000 C for between 1-3 milliseconds.

Example 28 includes the subject matter of any one of Examples 19-27, wherein the annealing further forms an oxide layer around the second material layers, and the method further comprises removing the oxide layer from around the second material layers.

Example 29 is an integrated circuit including a semiconductor device having one or more semiconductor nanoribbons extending between a source region and a drain region, a first spacer structure around first ends of the one or more semiconductor nanoribbons, a second spacer structure around second ends of the one or more semiconductor nanoribbons, and a gate structure around the one or more semiconductor nanoribbons and between the first and second spacer structures. At least one nanoribbon of the plurality of semiconductor nanoribbons includes a first region at one end of the nanoribbon having substantially no tin (Sn), a second region at the other end of the nanoribbon having substantially no tin, and a third region between the first and second regions. An entirety of the third region has a non-zero tin concentration, and the third region extends through an entire thickness of the at least one nanoribbon.

Example 30 includes the subject matter of Example 29, wherein the at least one nanoribbon comprises germanium and tin.

Example 31 includes the subject matter of Example 29 or 30, wherein the third region extends along an entire length of the at least one nanoribbon between the first and second regions.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a semiconductor device having one or more semiconductor nanoribbons extending between a source region and a drain region;
   a first spacer structure around first ends of the one or more semiconductor nanoribbons;
   a second spacer structure around second ends of the one or more semiconductor nanoribbons; and
   a gate structure around the one or more semiconductor nanoribbons and between the first and second spacer structures;
   wherein at least one nanoribbon of the one or more semiconductor nanoribbons includes a first region at one end of the nanoribbon having substantially no germanium (Ge), a second region at the other end of the nanoribbon having substantially no germanium, and a third region between the first and second regions, wherein an entirety of the third region has a same non-zero Ge concentration and the third region extends through an entire thickness of the at least one nanoribbon, wherein a first portion of the third region is beneath the first spacer structure adjacent to the first region and a second portion of the third region is beneath the second spacer structure adjacent to the second region.

2. The integrated circuit of claim 1, wherein the at least one nanoribbon comprises germanium and silicon.

3. The integrated circuit of claim 2, wherein the at least one nanoribbon comprises p-type silicon.

4. The integrated circuit of claim 1, wherein the third region has a Ge concentration between 10% and 90%.

5. The integrated circuit of claim 1, wherein the third region has a Ge concentration between 40% and 60%.

6. The integrated circuit of claim 1, wherein the first spacer structure is around the first region and the second spacer structure is around the second region.

7. The integrated circuit of claim 1, wherein a thickness of the third region of the at least one nanoribbon is less than a thickness of either the first or second regions of the at least one nanoribbon.

8. A printed circuit board comprising the integrated circuit of claim 1.

9. An electronic device, comprising:
   a chip package comprising one or more dies, at least one of the one or more dies comprising
      a semiconductor device having one or more semiconductor nanoribbons extending between a source region and a drain region;
      a first spacer structure around first ends of the one or more semiconductor nanoribbons;
      a second spacer structure around second ends of the one or more semiconductor nanoribbons; and
      a gate structure around the one or more semiconductor nanoribbons and between the first and second spacer structures;
      wherein at least one nanoribbon of the one or more semiconductor nanoribbons includes a first region at one end of the nanoribbon having substantially no germanium (Ge), a second region at the other end of the nanoribbon having substantially no germanium, and a third region between the first and second regions, wherein an entirety of the third region has a same non-zero Ge concentration and the third region extends through an entire thickness of the nanoribbon, wherein a first portion of the third region is beneath the first spacer structure adjacent to the first region and a second portion of the third region is beneath the second spacer structure adjacent to the second region.

10. The electronic device of claim 9, wherein the at least one nanoribbon comprises germanium and silicon.

11. The electronic device of claim 10, wherein the at least one nanoribbon comprises p-type silicon.

12. The electronic device of claim 9, wherein the third region has a Ge concentration between 10% and 90%.

13. The electronic device of claim 9, wherein the first spacer structure is around the first region and the second spacer structure is around the second region.

14. The electronic device of claim 9, wherein a thickness of the third region of the at least one nanoribbon is less than a thickness of either the first or second regions of the at least one nanoribbon.

15. The electronic device of claim 9, further comprising a printed circuit board, wherein the chip package is attached to the printed circuit board.

16. An integrated circuit comprising:
a semiconductor device having a plurality of semiconductor nanoribbons extending between a source region and a drain region;
a first spacer structure around first ends of the plurality of semiconductor nanoribbons;
a second spacer structure around second ends of the plurality of semiconductor nanoribbons; and
a gate structure around the semiconductor nanoribbons and between the first and second spacer structures;
wherein at least one nanoribbon of the plurality of semiconductor nanoribbons includes a first region at one end of the nanoribbon having substantially no germanium (Ge), a second region at the other end of the at least one nanoribbon having substantially no germanium, a third region adjacent to the first region, a fourth region adjacent to the second region, and a fifth region between the third and fourth regions, wherein an entirety of the third, fourth, and fifth regions has a same non-zero germanium concentration, the fifth region extends through an entire thickness of the at least one nanoribbon, the first and third regions directly contact each other and directly contact the first spacer structure, and the second and fourth regions directly contact each other and directly contact the second spacer structure.

17. The integrated circuit of claim 16, wherein the at least one nanoribbon comprises germanium and silicon.

18. The integrated circuit of claim 16, wherein the fifth region extends along an entire length of the at least one nanoribbon between the third and fourth regions.

19. The integrated circuit of claim 16, wherein the third, fourth, and fifth regions have a Ge concentration between 40% and 60%.

20. The integrated circuit of claim 16, wherein a thickness of the fifth region of the at least one nanoribbon is less than a thickness of any of the first, second, third, or fourth regions of the at least one nanoribbon.

* * * * *